United States Patent [19]
Derouiche

[11] Patent Number: 5,644,473
[45] Date of Patent: Jul. 1, 1997

[54] CARRIERS FOR IC PACKAGES

[75] Inventor: Nour Eddine Derouiche, Raleigh, N.C.

[73] Assignee: Mitsubishi Semiconductor America, Inc., Durham, N.C.

[21] Appl. No.: 517,122

[22] Filed: Aug. 21, 1995

[51] Int. Cl.⁶ .................. B65D 21/024; B65D 21/028; B65D 85/90; H01L 23/055
[52] U.S. Cl. .................. 361/732; 361/729; 361/735; 439/525; 439/526; 439/70; 257/678; 257/686; 206/504; 206/509; 206/724; 206/726
[58] Field of Search ............... 174/52.1–52.4; 206/503, 504, 509, 722, 724, 726; 257/678, 685–688, 797; 361/728, 729, 731, 732, 735, 740–742, 744, 747, 807–809, 811, 813; 439/68, 70, 330, 525, 526, 928, 928.1

[56] References Cited

U.S. PATENT DOCUMENTS

| | | | |
|---|---|---|---|
| 3,760,937 | 9/1973 | Van Wyngarden et al. | 206/504 |
| 4,729,744 | 3/1988 | Bet et al. | 439/717 |
| 4,777,565 | 10/1988 | Mcintosh | 361/816 |
| 5,032,953 | 7/1991 | Carl et al. | |
| 5,059,557 | 10/1991 | Cragon et al. | |
| 5,315,239 | 5/1994 | Vitriol | |
| 5,329,423 | 7/1994 | Scholz | |
| 5,343,366 | 8/1994 | Cipolla et al. | |
| 5,394,010 | 2/1995 | Tazawa et al. | |
| 5,407,362 | 4/1995 | Carstens et al. | |

FOREIGN PATENT DOCUMENTS 59-17269 A  1/1984  Japan ..................... 257/685

*Primary Examiner*—Donald Sparks
*Attorney, Agent, or Firm*—Lowe, Price, LeBlanc & Becker

[57] ABSTRACT

Each IC package carrier holds a single ZIP or SIP package between its side walls having openings to provide air flow for cooling the package and to allow heat generated within the package to dissipate. A locking strip member is provided to prevent loosening of the held package. Locking elements of snap fasteners are mounted on the side walls to allow several IC package carriers be attached to each other for producing an IC package assembly. The IC package assembly held by the several attached carriers can be inserted into a socket to connect circuits within the packages with external circuitry.

10 Claims, 5 Drawing Sheets

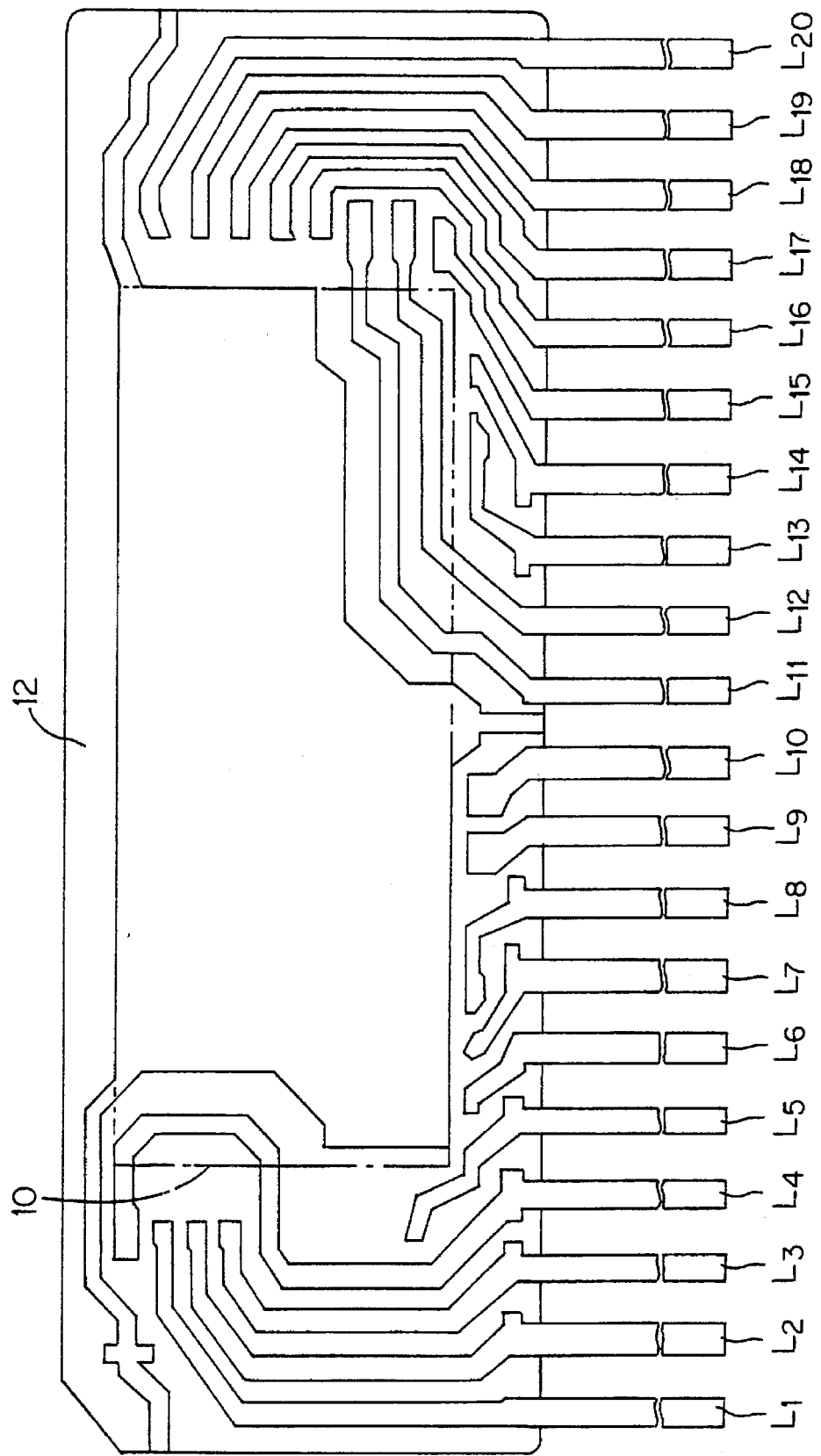

CARRIERS FOR IC PACKAGES

TECHNICAL FIELD

The present invention relates generally to integrated circuit packaging, and more particularly, to carriers for integrated circuit (IC) packages that can be attached to each other to produce an IC package assembly.

BACKGROUND ART

In an electronic system, components must be mounted on some interconnection network for communication to other parts of the system. The components of various types and configurations can be attached to a printed circuit board (PCB) to make the board a functional electronic device. To reduce costs of the assembly, semiautomatic or automatic insertion of components into PCBs are employed. However, multi-leaded components, e.g. integrated circuits, present problems for semiautomatic or automatic assembly because of lack of uniformity of body size and shape, difficulty of maintaining desired lead conditions, and feed problems at the input to insertion mechanisms. Successful mechanized assembly for integrated circuits is being achieved by using relatively standard integrated circuit (IC) packages. For example, dual in-line IC packages (DIP) that have two rows of vertical leads insertable into a PCB may be used for 256K dynamic RAMs.

For dynamic RAMs of 1M or more, zigzag in-line IC packages (ZIP) and single in-line IC packages (SIP) are used. Referring to FIGS. 1A and 1B respectively showing side and bottom views of a ZIP package, this type of IC package has two rows of leads L1–L20 arranged in a zigzag pattern along the bottom edge of the package.

As shown in FIG. 1C, the ZIP package may comprise a semiconductor chip 10 sealed by a sealing 12 made of epoxy resin. The leads L1–L20 may be connected to bonding pads of the chip 10 using gold wires. For example, a 1M×9 or 4M×9 RAM may be incorporated into the chip 10. As shown in FIG. 2, a SIP package has a single row of leads aligned along the bottom edge.

Suitable packages for an integrated circuit must satisfy a series of requirements. They must be strong enough mechanically to withstand the stresses occurring during use and provide easily established and reliable electrical connection from the circuit inside to the outer world.

To provide an IC package assembly, for example, a memory module of very high capacity, a group of IC packages are usually assembled on a printed circuit (PC) carrier interconnected with a system PCB that carries the circuits to be connected with the inner circuits of the IC packages. FIG. 3 illustrates an example of a module having nine IC packages 2 mounted on a PC carrier 4 inserted into a system PCB 6. Soldering is used for attaching the IC packages to the PC carrier. However, the manufacturing of the PCB-based assembly is a very demanding and expensive technological endeavor requiring sophisticated processes and machinery. In particular, the manufacturing sequence may incorporate the steps of solder paste application, solder paste baking out, reflow soldering, solvent cleaning and final inspection.

Moreover, due to miniaturization, any soldering procedure substantially affects the quality and reliability of the assembly and reduces its life expectancy.

Further, due to high packaging densities, heat generated within the packages can damage the packaged circuit. Metal heat sinks or other heat transfer means should be bonded to the PC carrier to absorb and disperse heat from operating IC packages. As a result, packaging density is reduced and manufacturing cost is increased.

Therefore, it would be desirable to provide IC package carriers that allow the IC package assembly to be produced without using a PC carrier. Also, it would be desirable to produce the IC package assembly without soldering.

DISCLOSURE OF THE INVENTION

Accordingly, one advantage of the invention is in providing IC package carriers that allow an IC package assembly composed of a plurality of IC packages to be produced without a PC carrier.

Another advantage of the invention is in providing IC package carriers that allow IC packages to be assembled into an IC package assembly without soldering.

The above and other advantages of the invention are achieved, at least in part, by providing an electronic package carrier that comprises a frame having side walls spaced with respect to each other so as to accommodate an electronic package therebetween. At least one of the side walls is provided with locking elements for attaching the frame to at least one other frame for electronic packages. The frames are rigidly oriented by the locking elements so as to establish a prescribed alignment of the packages with respect to each other or a set of external conductors.

In accordance with one aspect of the invention, the fastening means comprises a snap fastener. Each of the side walls has an opening and at least two portions for carrying at least two of the locking elements. The fastener fixes the frames to each other so as to provide a prescribed separation between the electronic packages inserted into the frames.

In accordance with another aspect of the invention, the frame comprises a transverse wall having a bottom portion and a top portion inclined with respect to the bottom portion at an angle corresponding to an inclination angle of a cut formed on a front edge of the electronic package to prevent loosening of the electronic package held between the sidewalls.

In accordance with a further aspect of the invention, a bottom surface of the frame has an opening for receiving the electronic packages so that they have their leads projecting from the opening.

Preferably, the frame and the fastener are made of elastic materials.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 1C illustrates an exemplary internal structure of the ZIP package shown in FIGS. 1A–1B.

BEST MODE FOR CARRYING OUT THE INVENTION

Although the invention has general applicability in the field of electronic packaging, the best mode for practicing the invention is based in part on the realization of a structure for carrying SIP and ZIP packages which have terminals or lead wires only along one edge of the package. However, it is to be understood that the present invention is also applicable to structures for carrying DIP packages.

Figure 4:
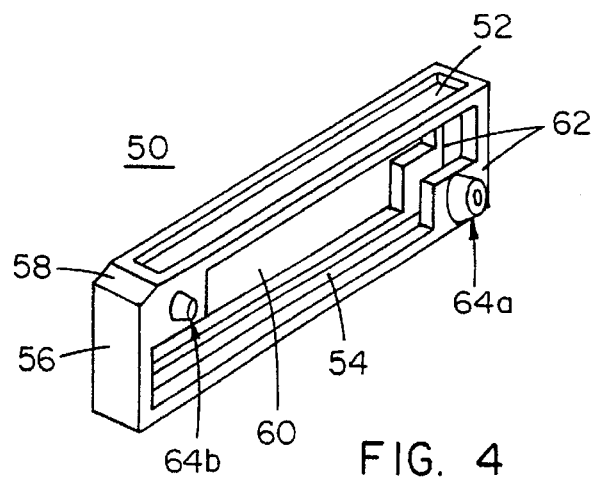
FIG. 4 shows an IC package carrier for holding a single IC package.

Reference is now made to FIG. 4 showing a single-device carrier 50 for a SIP or ZIP package. The carrier is made of elastic material, e.g. plastic, and has openings 52 and 54 on its top and bottom surfaces, respectively. The width of the openings 52 and 54 is selected so as to accommodate tightly SIP and ZIP packages pressed from the bottom surface of the carrier 50. The length of the bottom opening 54 is selected so as to allow a SIP or ZIP package to be inserted. The length of the top opening 52 is less than the bottom opening length to prevent the inserted SIP or ZIP package from passing through the top surface of the carrier 50.

Figure 2:
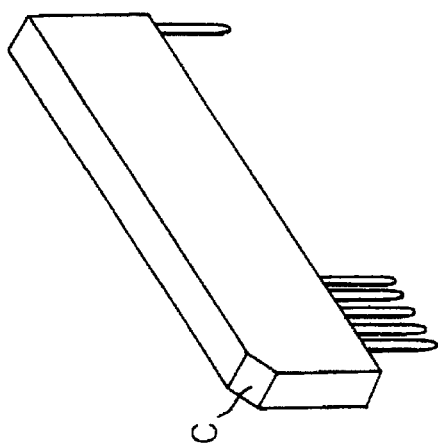
FIG. 2 shows an example of a SIP package.
Figure 1A:
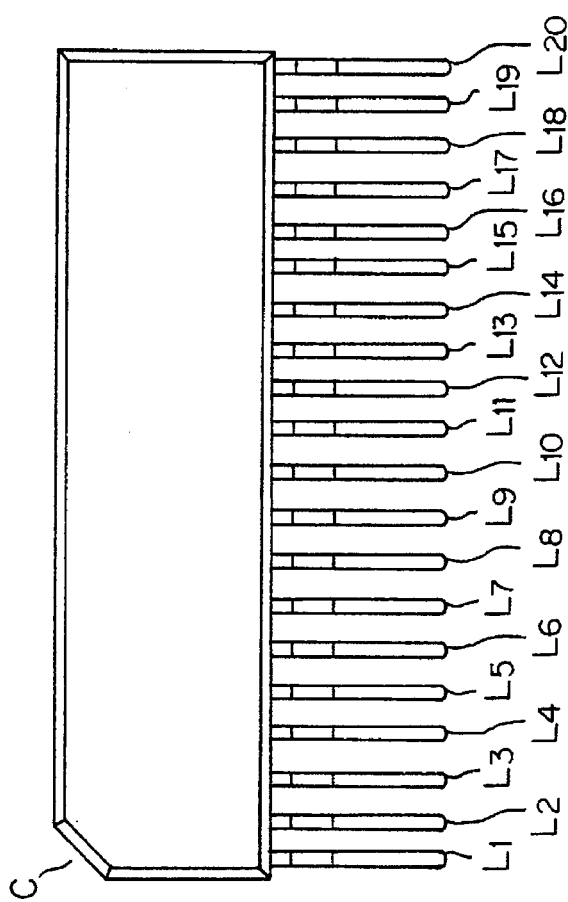
FIGS. 1A–1B show side and bottom views of a ZIP package.
Figure 1B:
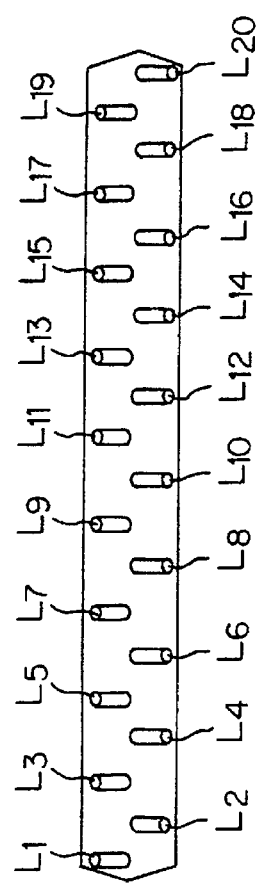
Figure 3:
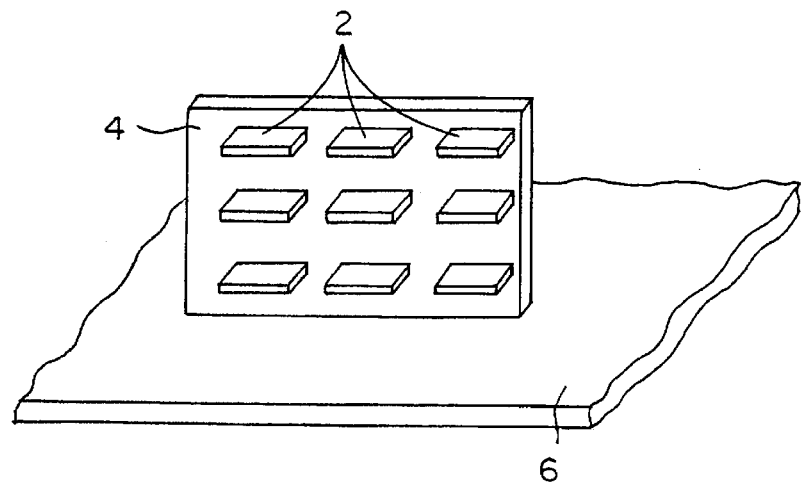
FIG. 3 illustrates a module mounted on a PC carrier.

A transverse wall 56 is inclined with respect to the top surface so as to establish a locking strip element 58 at the top portion of the wall 56 to prevent loosening of the inserted SIP or ZIP package in the carrier. The size of the locking strip element 58 and its inclination with respect to the top surface and side wall 56 of the carrier 50 are selected so as to accommodate an oblique cut C (FIGS. 1A, 2) provided at each of SIP and ZIP packages.

The side wall of the carrier 50 has an opening 60 and two portions 62 provided at the opposite corners. A male or female locking element of a snap fastener 64 is fixed at each of the wall portions 62 to attach the carrier 50 to another carrier. Opposite side surface of the carrier 50 is provided with opposite locking elements of the snap fastener 64. For example, the front side wall shown in FIG. 4 has a female locking element 64a on its bottom portion, and a male locking element 64b on its top portion. By contrast, the rear side wall has a male locking element 64b on its bottom portion, and a female locking element 64a on its top portion.

Figure 5:
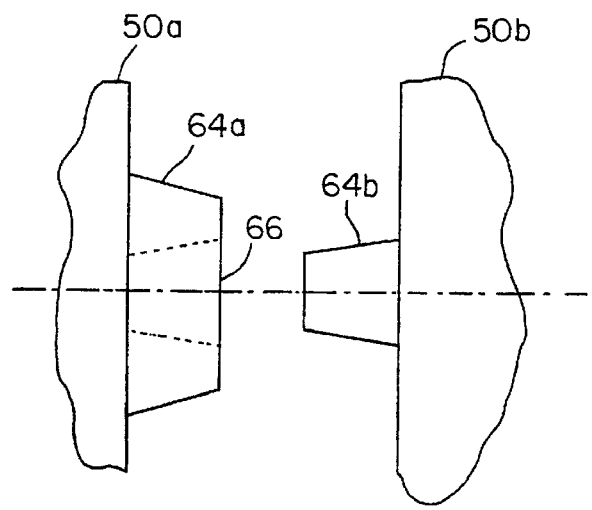
FIG. 5 illustrates interaction between male and female locking elements of a snap fastener.

As shown in FIG. 5, the male locking element 64b on one of the carriers 50a is pressed manually or mechanically into an opening 66 of the female locking element 64a on another carrier 50b to engage the carriers 50 with each other. Simultaneously, the male locking element 64b of the carrier 50b is pressed into the female locking element of the carrier 50a. The locking elements 64a and 64b are made of elastic material, e.g. plastic, to provide tight engagement.

Figure 6:
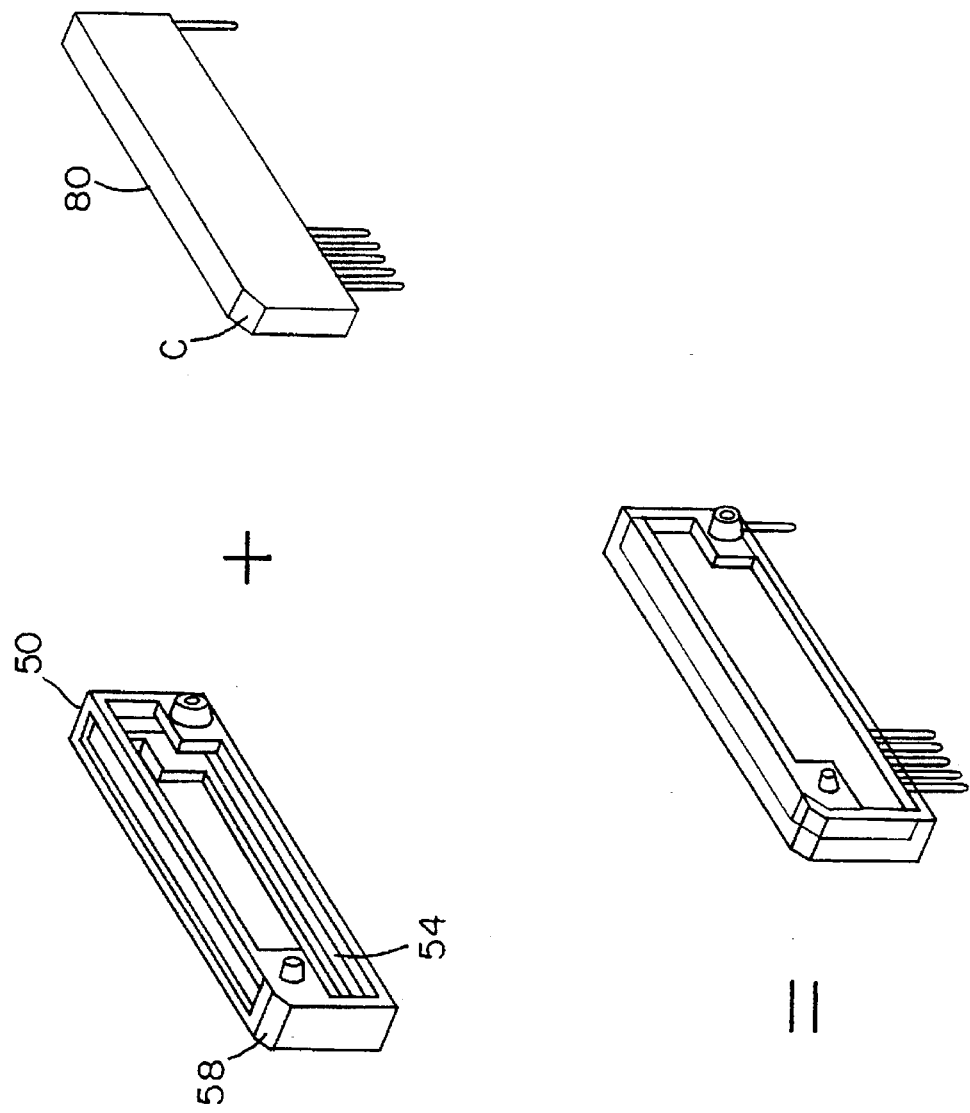
FIG. 6 illustrates insertion of the IC package into the IC package carrier.

Referring to FIG. 6, a SIP or ZIP package 80 can be inserted into the carrier 50 through the opening 54 on its bottom surface. The package 80 is positioned so as to have its oblique cut C in front of the locking strip element 58 and is pressed into the carrier 50 until the cut C comes up against the locking element 58. As a result, the package 80 is fixed between the side walls of the carrier 50 and has its leads projecting from the opening 54. The size of the carrier 50 is selected so to fit tightly the package 80. Moreover, the carrier 50 is made of elastic material to ensure that the package 80 is held firmly. The openings on the side walls and top surface of the carrier 50 provide an air flow for cooling the package 80 and allow heat generated within the package 80 to dissipate.

Figure 7:
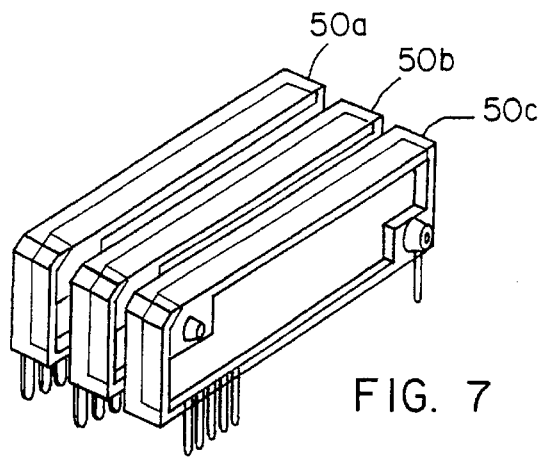
FIG. 7 shows multiple IC package carriers attached to each other by the snap fasteners.

As shown in FIG. 7, the locking elements 64a and 64b on the sidewalls of the carriers 50a, 50b, and 50c allow these carriers to be attached to each other to create an IC assembly without PCB. For example, a 1M×9 three-chip memory array can be assembled using the carriers 50a, 50b and 50c attached to each other. Although FIG. 7 illustrates a set comprising three carriers for holding SIP or ZIP packages, it is to be understood that any number of the carriers 50 can be attached to each other.

Figure 8:
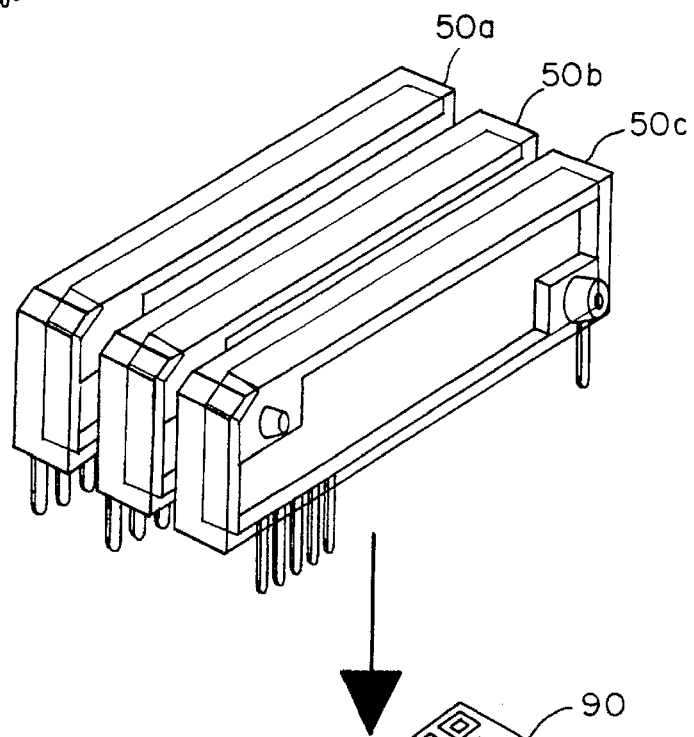
FIG. 8 illustrates insertion of a carrier assembly filled with the IC packages into a socket.
Figure 8:
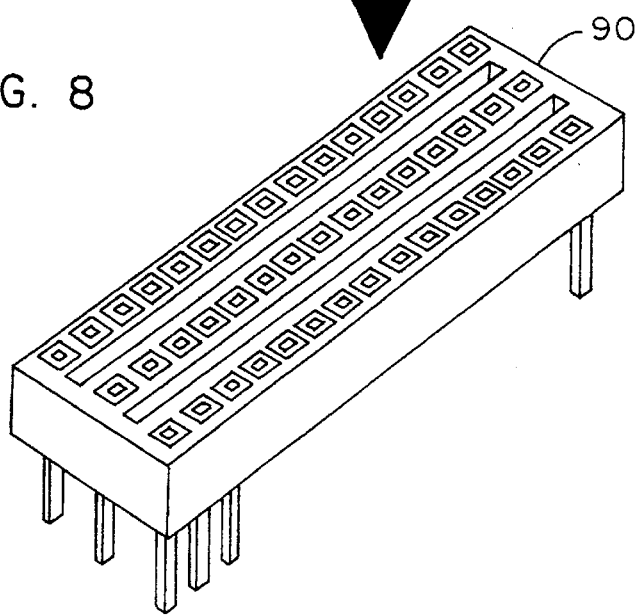

Referring to FIG. 8, the package assembly held by the carriers 50a, 50b and 50c attached to each other may be inserted into a socket 90 to provide electrical connection between inner circuits of the package assembly and a set of external conductors coupled to the socket 90. Alternatively, the package assembly held by the carriers 50a, 50b, and 50c may be soldered onto a system printed circuit board that carries the external conductors to be connected with the inner circuits of the package assembly.

In summary, the results and advantages of the carriers for IC packages can now be more fully appreciated. Each carrier holds a single ZIP or SIP package between its side walls having openings to provide air flow for cooling the package and to allow heat generated within the package to dissipate. A locking strip member is provided to prevent loosening of the held package and to align the leads of the package with respect to a connector or circuit board. Locking elements of snap fasteners are mounted on the side walls to allow several carriers to be attached to each other for producing an IC package assembly. The IC package assembly held by the several attached carriers can be inserted into a socket to connect circuits within the packages with external circuitry.

Accordingly, the IC package carriers of the present invention allows an IC package assembly composed of a plurality of IC packages to be produced without a PC carrier.

It will also be recognized that the multiple device carrier of the present invention allows the IC packages to be assembled into the IC package assembly without soldering.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. An electronic package carrier comprising a frame made of elastic material, and having side walls spaced with respect to each other so as to accommodate an electronic package therebetween, at least one of said side walls being provided with locking elements for attaching said frame to at least one other frame for receiving electronic packages, the frames being rigidly oriented by said locking elements so as to establish a prescribed alignment of said packages with respect to each other or a set of external conductors.

2. The carrier of claim 1, wherein said locking elements includes a snap fastener.

3. The carrier of claim 1, wherein each of said side walls has an opening and at least two portions around said opening for carrying at least two of said locking elements.

4. The carrier of claim 1, wherein said locking elements fix said frame to said at least one other frame so as to provide a prescribed separation between the electronic packages inserted into the frames.

5. The carrier of claim 1, wherein said frame further comprises a transverse wall arranged perpendicular to said side walls and having a bottom portion and a top portion inclined with respect to said bottom portion at an angle corresponding to an inclination angle of a cut formed on a front edge of the electronic package to prevent loosening of the electronic package held between said sidewalls.

6. The carrier of claim 1, wherein said locking elements are made of elastic material.

7. The carrier of claim 1, wherein a bottom surface of said frame has an opening for receiving the electronic package.

8. The carrier of claim 7, wherein the electronic package is inserted from the bottom surface, and has leads projecting from the opening in the bottom surface.

9. An electronic package carrier comprising a parallelepiped frame made of elastic material and composed of side walls and transverse walls arranged so as to accommodate an electronic package therebetween, at least one of said transverse walls having a bottom portion and a top portion inclined with respect to the bottom portion to fit for a cut on a front edge of the electronic package, a pair of male and female locking elements of a fastening means being mounted on at least one of said side walls for providing side-by-side engagement between said frame and another electronic package carrier to establish a prescribed alignment of electronic packages held by said frame and said another electronic package carrier with respect to each other or a set of external conductors.

10. An integrated circuit (IC) assembly comprising a plurality of IC packages having leads, a plurality of carriers attached to each other for holding said plurality of IC packages, and having openings for receiving the IC packages, and a socket connector for receiving the leads projecting from the openings to connect said plurality of IC packages with a set of external conductors, each of the carriers having locking elements for attaching the carriers to each other so as to establish a prescribed alignment of the IC packages with respect to each other and said connector.

* * * * *